United States Patent
Saeedi et al.

(10) Patent No.: US 10,672,964 B2
(45) Date of Patent: Jun. 2, 2020

(54) CMOS THERMAL-DIFFUSIVITY TEMPERATURE SENSOR BASED ON POLYSILICON

(71) Applicant: Oracle International Corporation, Redwood Shores, CA (US)

(72) Inventors: Saman Saeedi, Redwood City, CA (US); Frankie Y. Liu, Palo Alto, CA (US); Yue Zhang, San Mateo, CA (US); Suwen Yang, Mountain View, CA (US)

(73) Assignee: Oracle International Corporation, Redwood Shores, CA (US)

( * ) Notice: Subject to any disclaimer, the term of this patent is extended or adjusted under 35 U.S.C. 154(b) by 317 days.

(21) Appl. No.: 15/237,281

(22) Filed: Aug. 15, 2016

(65) Prior Publication Data

US 2018/0045579 A1    Feb. 15, 2018

(51) Int. Cl.
*G01K 7/00* (2006.01)
*H01L 35/12* (2006.01)
*H01L 35/32* (2006.01)
*G01K 7/02* (2006.01)
*G01K 7/42* (2006.01)

(52) U.S. Cl.
CPC .............. *H01L 35/12* (2013.01); *G01K 7/028* (2013.01); *G01K 7/42* (2013.01); *H01L 35/32* (2013.01)

(58) Field of Classification Search
None
See application file for complete search history.

(56) References Cited

U.S. PATENT DOCUMENTS

| | | | | |
|---|---|---|---|---|
| 8,552,380 B1* | 10/2013 | Florin | ...................... | G01J 5/023 250/338.4 |
| 2009/0212875 A1* | 8/2009 | Makinwa | ................ | H03B 17/00 331/34 |
| 2011/0187428 A1* | 8/2011 | Kashmiri | ................ | H03L 1/022 327/159 |
| 2012/0267532 A1* | 10/2012 | Udrea | ...................... | G01J 3/108 250/338.5 |
| 2013/0147528 A1* | 6/2013 | Makinwa | ................ | H03L 1/022 327/141 |

(Continued)

OTHER PUBLICATIONS

Takao et al.; "Compact BJT-Based Thermal Sensor for Processor Applications in a 14 nm tri-Gate CMOS Process." Solid-State Circuits, IEEE Journal of 50.3 (2015): 799-807.

(Continued)

*Primary Examiner* — Lisa M Caputo
*Assistant Examiner* — Nasir U. Ahmed
(74) *Attorney, Agent, or Firm* — Park, Vaughan, Fleming & Dowler LLP

(57) ABSTRACT

The disclosed embodiments relate to the design of a temperature sensor, which is integrated into a semiconductor chip. This temperature sensor comprises an electro-thermal filter (ETF) integrated onto the semiconductor chip, wherein the ETF comprises: a heater; a thermopile, and a heat-transmission medium that couples the heater to the thermopile, wherein the heat-transmission medium comprises a polysilicon layer sandwiched between silicon dioxide layers. It also comprises a measurement circuit that measures a transfer function through the ETF to determine a temperature reading for the temperature sensor.

18 Claims, 7 Drawing Sheets

(56) References Cited

U.S. PATENT DOCUMENTS

2014/0291704 A1* 10/2014 Ali .................... H01L 33/34
257/88

OTHER PUBLICATIONS

Van Vroonhoven et al.; "Thermal diffusivity sensing: A new temperature sensing paradigm." Custom Integrated circuits Conference (CICC), 2011 IEEE. IEEE, 2011.

Sonmez et al.; "1650 um2 thermal-diffusivity sensor with inaccuracies down to ±0.75° C in 40nm CMOS" Solid-State Circuits Conference, 2016. ISSCC 2016. Digest of Technical Papers. IEEE International. IEEE, 2016.

Xia et al.; "Design of an optimized electrothermal filter for a temperature-to-frequency converter." Sensors, 2007 IEEE. IEEE, 2007.

Van Vroonhoven et al.; "A CMOS Temperature-to-Digital Converter with an Inaccuracy of±0.5° C (3/spl sigma) from-55 to 125° C." Solid-State Circuits Conference, 2008. ISSCC 2008. Digest of Technical Papers. IEEE International. IEEE, 2008.

Tai et al.; "Thermal conductivity of heavily doped low pressure chemical vapor deposited polycrystalline silicon films." Journal of Applied Physics 63.5 (1988): 1442-1447.

Van Vroonhoven et al.; "An SOI thermal-diffusivity-based temperature sensor with±0.6° C (3 ) untrimmed inaccuracy from 70° C to 225° C." Sensors and Actuators A: Physical 188 (2012): 66-74.

Veijola; "Model for thermal spreading impedance in GaAs MESFETs." Electronics, Circuits, and Systems, 1996. ICECS'96., Proceedings of the Third IEEE International Conference on. vol. 2. IEEE, 1996.

Quan et al.; "27.8 A 4600 m 2 1.5° C (3 ) 0.9 kS/s thermal-diffusivity temperature sensor with VCO-based readout." Solid-State Circuits Conference—(ISSCC), 2015 IEEE International. IEEE, 2015.

Kashmira et al.; "A temperature-to-digital converter based on an optimized electrothermal filter." Solid-State Circuits, IEEE Journal of 44.7 (2009): 2026-2035.

Angevare et al.; "A 2800-um2 thermal-diffusivity temperature sensor with VCO-based readout in 160-nm CMOS." Solid-State Circuits Conference (A-SSCC), 2015 IEEE Asian. IEEE, 2015.

* cited by examiner

CMOS THERMAL-DIFFUSIVITY TEMPERATURE SENSOR BASED ON POLYSILICON

BACKGROUND

Field

The disclosed embodiments relate to the design of a temperature sensor for a semiconductor chip. More specifically, the disclosed embodiments relate to the design of a complementary metal-oxide-semiconductor (CMOS) thermal-diffusivity temperature sensor implemented on a semiconductor chip.

Related Art

Recent advances in computational performance have been achieved by integrating larger numbers of processor cores into a single microprocessor chip. Such large-scale integration of processor circuitry has given rise to extremely high power densities on chip, which in turn has created challenging thermal-management issues. These thermal-management issues are typically handled through the use of on-chip temperature sensors. Currently, on-chip temperature sensors are implemented using bandgap temperature sensors, which measure the forward voltage of a silicon diode, such as the base-emitter junction of a bipolar junction transistor (BJT). An analog-to-digital converter is then typically used to measure the output voltage of the bandgap sensor, and a look-up table is used to convert the measured output voltage to corresponding temperature.

Unfortunately, this approach has a number of disadvantages. Each bandgap temperature sensor requires multiple calibration steps during system assembly because manufacturing process variations can cause device characteristics to vary considerably from chip to chip and wafer to wafer. Moreover, this calibration process can be quite time-consuming because modern processor chips are being designed with several dozen on-chip temperature sensors. Also, to calibrate a processor chip, the chip needs to be kept in an isothermal state (e.g., within 1° C.) during the calibration process, and it is very hard meet this requirement. It is also becoming difficult to implement temperature sensors in more-advanced CMOS technologies because the temperature sensors are highly analog and require a large amount of voltage headroom (about 1.5 V); this voltage headroom is typically unavailable in more-advanced CMOS technologies that provide a core transistor voltage of 1.0 V.

Hence, what is needed is a temperature sensor that accurately measures on-chip temperatures without the drawbacks of existing bandgap temperature sensors.

SUMMARY

The disclosed embodiments relate to the design of a temperature sensor, which is integrated into a semiconductor chip. This temperature sensor comprises an electro-thermal filter (ETF) integrated onto the semiconductor chip, wherein the ETF comprises: a heater; a thermopile; and a heat-transmission medium that couples the heater to the thermopile, wherein the heat-transmission medium comprises a polysilicon layer sandwiched between silicon dioxide layers. It also comprises a measurement circuit that measures a transfer function through the ETF to determine a temperature reading for the temperature sensor.

In some embodiments, the heater is comprised of polysilicon.

In some embodiments, the thermopile is comprised of polysilicon.

In some embodiments, the thermopile comprises a sequence of alternating N+ and P+ segments of polysilicon having opposite temperature gradients.

In some embodiments, the heater, the thermopile and the polysilicon layer in the heat-transmission medium are all implemented in a single polysilicon layer.

In some embodiments, the measurement circuit has a constant-frequency architecture that applies a constant frequency to the ETF and measures a resulting phase shift $\Phi_{ETF}$, which is translated into the temperature reading.

In further variations on these embodiments, the constant-frequency architecture uses sigma-delta modulation to measure the resulting phase shift $\Phi_{ETF}$.

In variations on these embodiments, the constant-frequency architecture comprises: (1) a constant-frequency input that feeds into an input of the ETF and into a phase rotator; (2) the phase rotator with an input and an output; (3) a mixer that mixes an output of the ETF with the output of the phase rotator to produce a mixed signal; (4) an integrator that integrates the mixed signal to produce an integrated signal; and (5) an analog-to-digital converter (ADC) that converts the integrated signal into a digital output, which feeds into the input of the phase rotator.

In some embodiments, the measurement circuit has a constant-phase architecture that applies a constant phase shift to the ETF and measures a resulting frequency $f_{ETF}$, which is translated into the temperature reading.

In variations on these embodiments, the constant-phase architecture comprises: (1) a mixer that mixes an output of the ETF with a voltage-controlled oscillator (VCO) output signal to produced a mixed signal; (2) an integrator that integrates the mixed signal to produce an integrated signal; and (3) a voltage-controlled oscillator (VCO) that receives the integrated signal and produces the VCO output signal, which feeds into inputs of the ETF and the mixer.

DETAILED DESCRIPTION

The following description is presented to enable any person skilled in the art to make and use the present embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present embodiments. Thus, the present embodiments are not limited to the embodiments shown, but are to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Semiconductor Chip with Temperature Sensors

Figure 1:
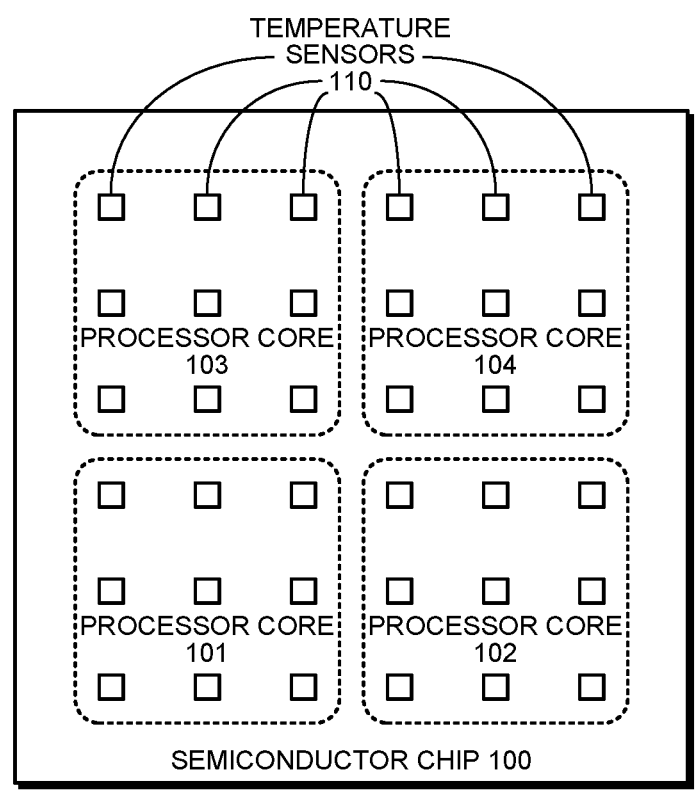
FIG. 1 illustrates a semiconductor chip with multiple processor cores and temperature sensors in accordance with the disclosed embodiments.

FIG. 1 illustrates a semiconductor chip 100 with multiple processor cores 101-104 and multiple temperature sensors 110 in accordance with the disclosed embodiments. In the illustrated embodiment, semiconductor chip 100 includes four processor cores 101-104, wherein each processor core includes nine temperature sensors 110 for a total of 36 temperature sensors. Note that the temperature sensors 110 are distributed spatially across the surface of semiconductor chip 110 to provide temperature measurements from different locations on semiconductor chip 100. These temperature measurements can be used to control operational parameters of processor cores 101-104, such as processor voltage, processor clock speed and processor load, to prevent overheating of portions of semiconductor chip 100. In general, semiconductor chip 100 can include more or fewer processor cores, and more or fewer temperature sensors. Moreover, temperature sensors 110 can be used to monitor temperature in any type of semiconductor chip and are not limited to microprocessor chips.

Thermal-Diffusivity Temperature Sensor

Figure 2:
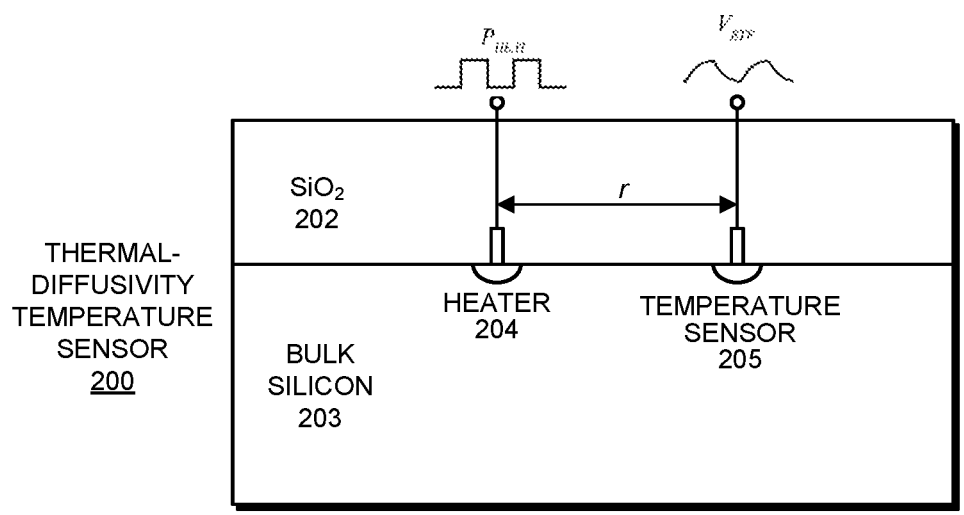
FIG. 2 illustrates a thermal-diffusivity temperature sensor implemented in bulk silicon.

Because of the above-described drawbacks of existing bandgap temperature sensors, researchers have begun investigating "thermal-diffusivity temperature sensors" to measure on-chip temperatures. For example, FIG. 2 illustrates an exemplary thermal-diffusivity temperature sensor 200, which is implemented in bulk silicon 203. As illustrated in FIG. 2, thermal-diffusivity temperature sensor 200 includes a bulk silicon substrate 203, which is overlain with a $SiO_2$ layer 202. Bulk silicon substrate 203 includes a heater 204 and a temperature sensor 205, which are separated by a distance r. When heater 204 is activated, a dynamic thermal gradient arises in the bulk silicon 203 between heater 204 and temperature sensor 205 as the heat generated by heater 204 diffuses through bulk silicon 203, wherein it is possible to measure characteristics of this diffusion process to determine the temperature of bulk silicon 203.

Note that thermal-diffusivity temperature sensor 200 comprises an "electro-thermal filter" (ETF), wherein a signal $P_{HEAT}$ can be applied to heater 204 and the resulting temperature variations cause a voltage signal $V_{ETF}$ to be generated by temperature sensor 205. This ETF provides a transfer function associated with the thermal-diffusivity of bulk silicon 203, wherein the transfer function is related to the temperature of bulk silicon 203. In particular, when thermal-diffusivity temperature sensor 200 is operating on a constant-phase mode, the resulting frequency $f_{ETF}$ is proportionate to $1/T^{1.8}$, wherein T is the temperature of bulk silicon 203. In contrast, when thermal-diffusivity temperature sensor 200 is operating in a constant-frequency mode, the resulting phase shift $\Phi_{ETF}$ is proportionate to $T^{0.9}$. (See van Vroonhoven, Caspar P. L., and Kofi A. A. Makinwa, "Thermal diffusivity sensing: A new temperature sensing paradigm," *Custom Integrated Circuits Conference (CICC)*, 2011 *IEEE*. IEEE, 2011, and Ugur Sonmez, Fabio Sebastiano, Kofi A. A. Makinwa, "1650 um2 thermal-diffusivity sensor with inaccuracies down to ±0.75° C. in 40 nm CMOS" *International Solid-State Circuits Conference, 2016. ISSCC 2016, Digest of Technical Papers, IEEE International*, IEEE, 2016.)

Note that thermal diffusivity in silicon or polysilicon is a function of absolute temperature. In chip-grade silicon, this transfer function does not vary significantly with manufacturing process variations from chip to chip and wafer to wafer. Hence, temperature can be measured using a thermal-diffusivity sensor with an accuracy of ~1° C. without calibration. This is a significant advantage over the above-described bandgap temperature sensors, which need to be calibrated because they are highly dependent on manufacturing process variations.

Unfortunately, the thermal-diffusivity temperature sensor illustrated in FIG. 2 has a number of limitations that are caused by an inherent tradeoff in the design of the temperature sensor. If heater 204 is located far from temperature sensor 205, the system burns a lot of power while creating the temperature gradient between heater 204 and temperature sensor 205 because of the significant thermal mass of bulk silicon 203. Note that this heating process also gives rise to a self-induced temperature error. On the other hand, if heater 204 and temperature sensor 205 are very close to each other, the system suffers from photolithography variations during manufacture, which can significantly limit the accuracy of thermal-diffusivity temperature sensor 200.

Thermal-Diffusivity Temperature Sensor Implemented in Polysilicon

Figure 3:
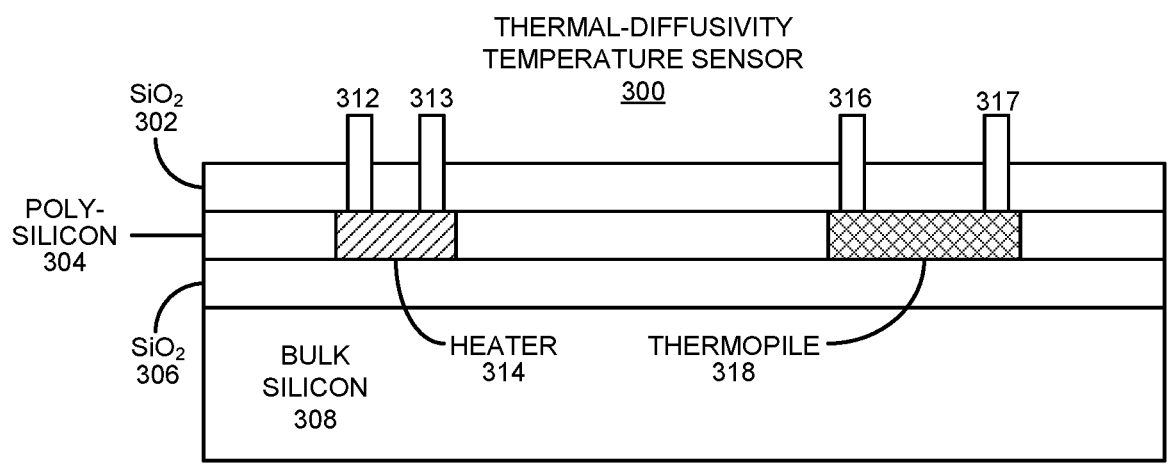
FIG. 3 illustrates a thermal-diffusivity temperature sensor implemented in polysilicon in accordance with the disclosed embodiments.

To overcome the above-described problems of thermal-diffusivity temperature sensor 200, which is implemented in bulk silicon, the disclosed embodiments implement a thermal-diffusivity temperature sensor 300 in a thin polysilicon layer 304 as is illustrated in FIG. 3. Thermal-diffusivity temperature sensor 300 illustrated in FIG. 3 comprises a thin polysilicon layer 304 sandwiched between two $SiO_2$ layers 302 and 306, wherein $SiO_2$ layer 306 is fabricated over a bulk silicon substrate 308. A heater 314 is formed by doping a portion of polysilicon layer 304 to become P+ polysilicon (or N+ polysilicon), which is connected to a power source through vias (or contacts) 312-313, which extend through $SiO_2$ layer 302. A thermopile (temperature sensor) 318 is formed by doping portions of polysilicon layer 304 to become P+ and N+ polysilicon segments that are interconnected with copper or aluminum. Thermopile 318 is connected to a voltage detector through vias (or contacts) 316-317, which extend through $SiO_2$ layer 302. In an exemplary embodiment, the thickness of $SiO_2$ layer 306 is 20 Å, the thickness of polysilicon layer 304 is 100 Å, the thickness of $SiO_2$ layer 302 is 300-500 Å, and the distance between heater 314 and thermopile 318 is 2 microns.

By using polysilicon as the heat-transmission medium, thermal-diffusivity temperature sensor 300 illustrated in FIG. 3 has a significantly reduced heat mass in comparison to thermal-diffusivity temperature sensor 200 illustrated in FIG. 2. This results in a lower heater power requirement. Moreover, using polysilicon to implement heater 314 and thermopile 318 results in a smaller device footprint and facilitates improved photolithography accuracy during manufacture, which also improves performance.

Supporting Circuitry

As mentioned above, thermal-diffusivity temperature sensor 300 illustrated in FIG. 3 comprises an ETF with a transfer function. Note that a number of ways exist to measure this transfer function, which is related to the thermal-diffusivity of polysilicon layer 304, wherein the thermal diffusivity is correlated with the temperature of polysilicon layer 304.

Figure 4A:
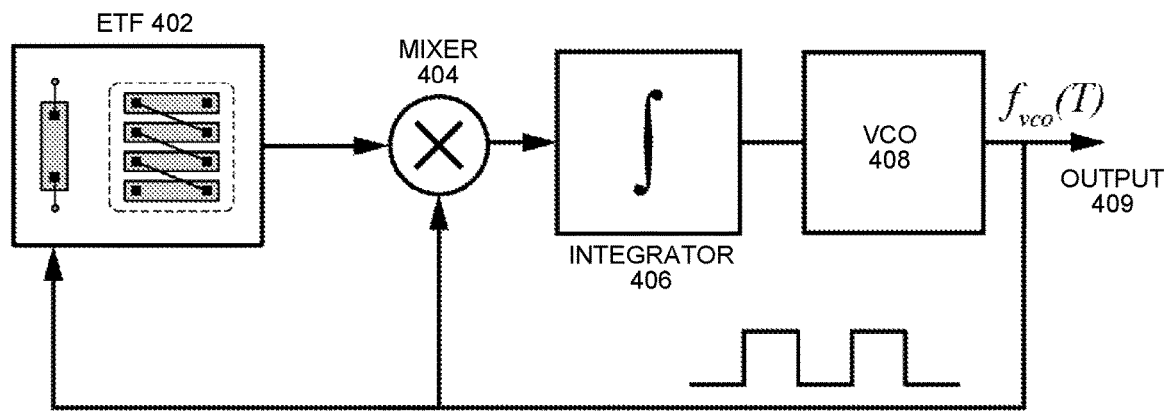
FIG. 4A illustrates a constant-phase circuit that measures thermal diffusivity in accordance with the disclosed embodiments.

For example, FIG. 4A illustrates a constant-phase circuit that measures this thermal-diffusivity in accordance with the disclosed embodiments. As illustrated in FIG. 4A, this constant-phase circuit includes an ETF 402, which generates an output that feeds into a first input of a mixer 404. The output of mixer 404 feeds into an integrator 406, which integrates the output of mixer 404 to generate an integrator output that feeds into the input of a voltage-controlled oscillator (VCO) 408. The output of VCO 408 provides a frequency signal $F_{VCO}(t)$, which comprises the output 409 of the constant-phase circuit, wherein the frequency signal $F_{VCO}(t)$ provides an indication of a phase relationship between its two inputs to mixer 404. Output 409 also feeds back into the input of ETF 402 and a second input of mixer 404.

Figure 4B:
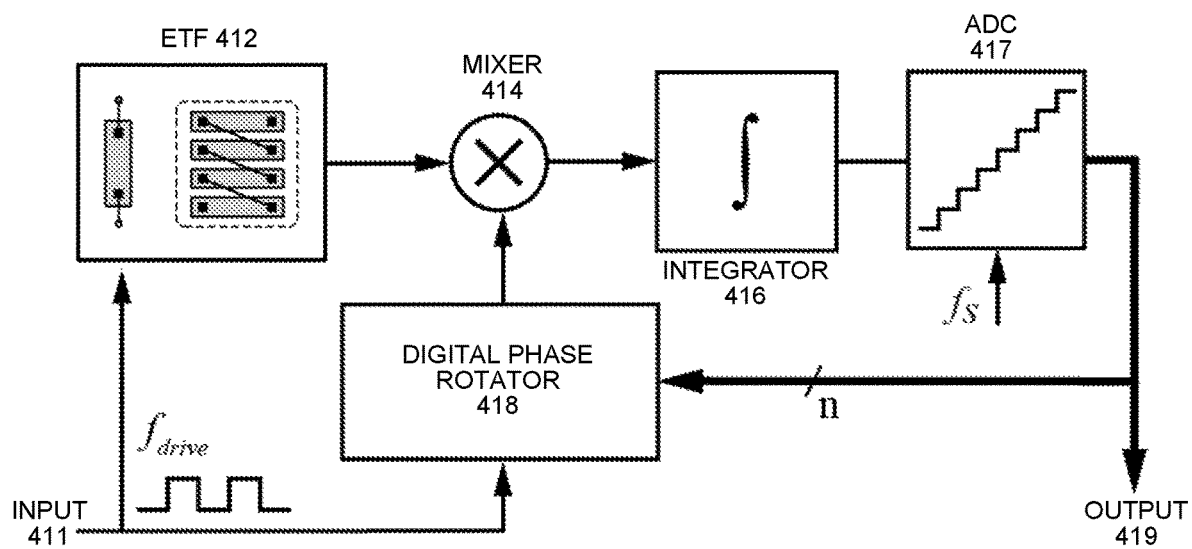
FIG. 4B illustrates a constant-frequency circuit that measures thermal diffusivity in accordance with the disclosed embodiments.

In contrast, FIG. 4B illustrates a constant-frequency circuit that measures thermal diffusivity in accordance with the disclosed embodiments. As illustrated in FIG. 4B, this constant-frequency circuit receives a constant-frequency input $f_{drive}$ 411, which feeds into the input of ETF 412 and also into a first input of a digital phase rotator 418. ETF 412 generates an output that feeds into a first input of mixer 414. The output of mixer 414 feeds into an integrator 416, which integrates the output of mixer 414 to generate an integrator output that provides an indication of the phase relationship between its two inputs to mixer 414. This integrator output feeds into an analog-to-digital converter (ADC) 417. ADC 417 produces a digital output that provides the output 419 of the constant-frequency circuit. Note that output 419 feeds back into a control input of a digital phase rotator 418.

Thermopile and Heater Design

Figure 5A:
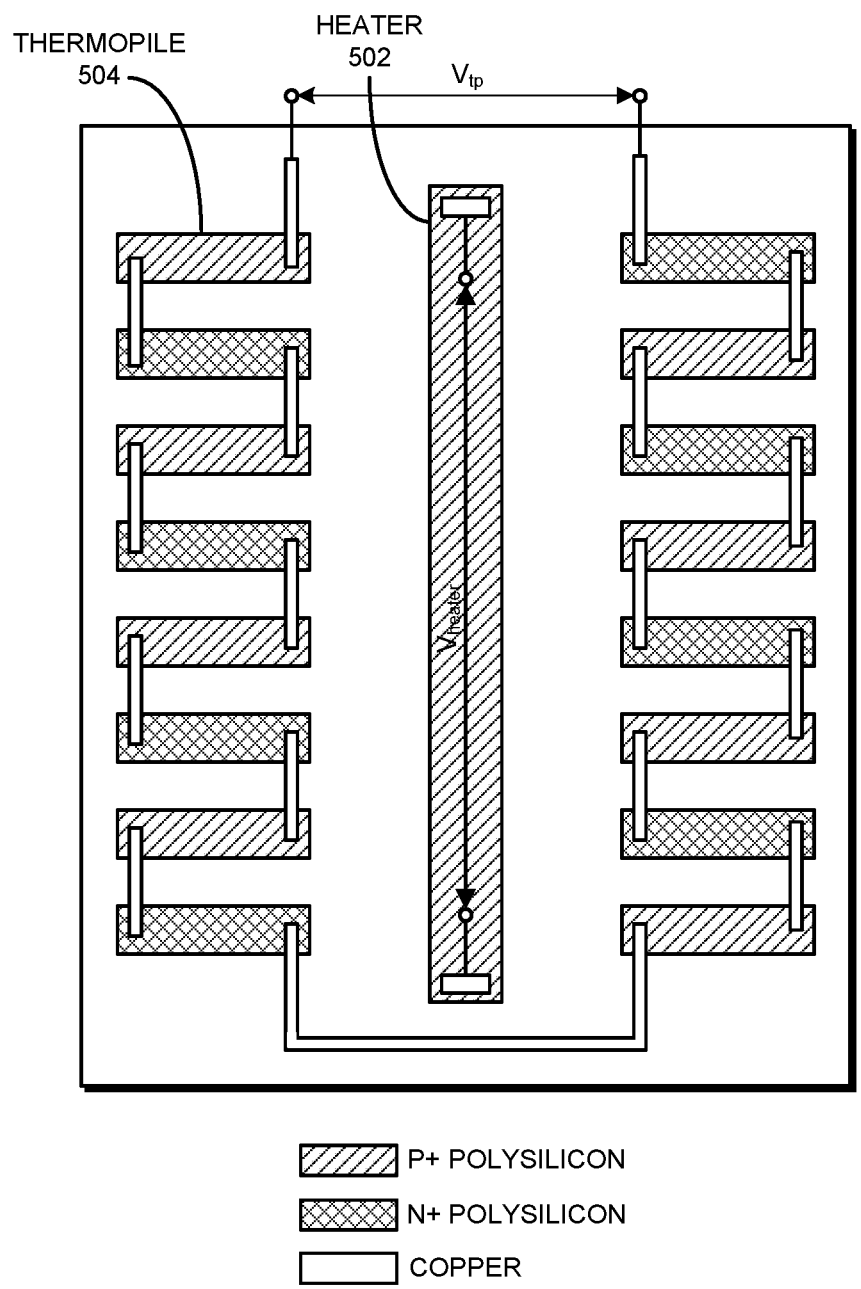
FIG. 5A illustrates a thermopile, which is implemented using alternating N+ and P+ segments of polysilicon having opposite temperature gradients, in accordance with the disclosed embodiments.

FIG. 5A illustrates an exemplary heater 502 and thermopile 504, which are both implemented in polysilicon in accordance with the disclosed embodiments. Heater 502 comprises a P+ segment of polysilicon which receives an input signal $V_{heater}$. (Note that heater 502 can alternatively be implemented in N+ polysilicon.) In contrast, thermopile 504 comprises alternating N+ and P+ segments of polysilicon, which are connected by copper (or possibly aluminum) segments. Because of the geometric configuration of the alternating N+ and P+ segments illustrated in FIG. 5A, the alternating segments have opposite temperature gradients. Moreover, the combination of the alternating segments and thermal gradients causes the thermopile voltage to increase monotonically as it traverses the alternating segments, which improves overall system performance by reducing power consumption and increasing temperature-sensing sensitivity.

Figure 5B:
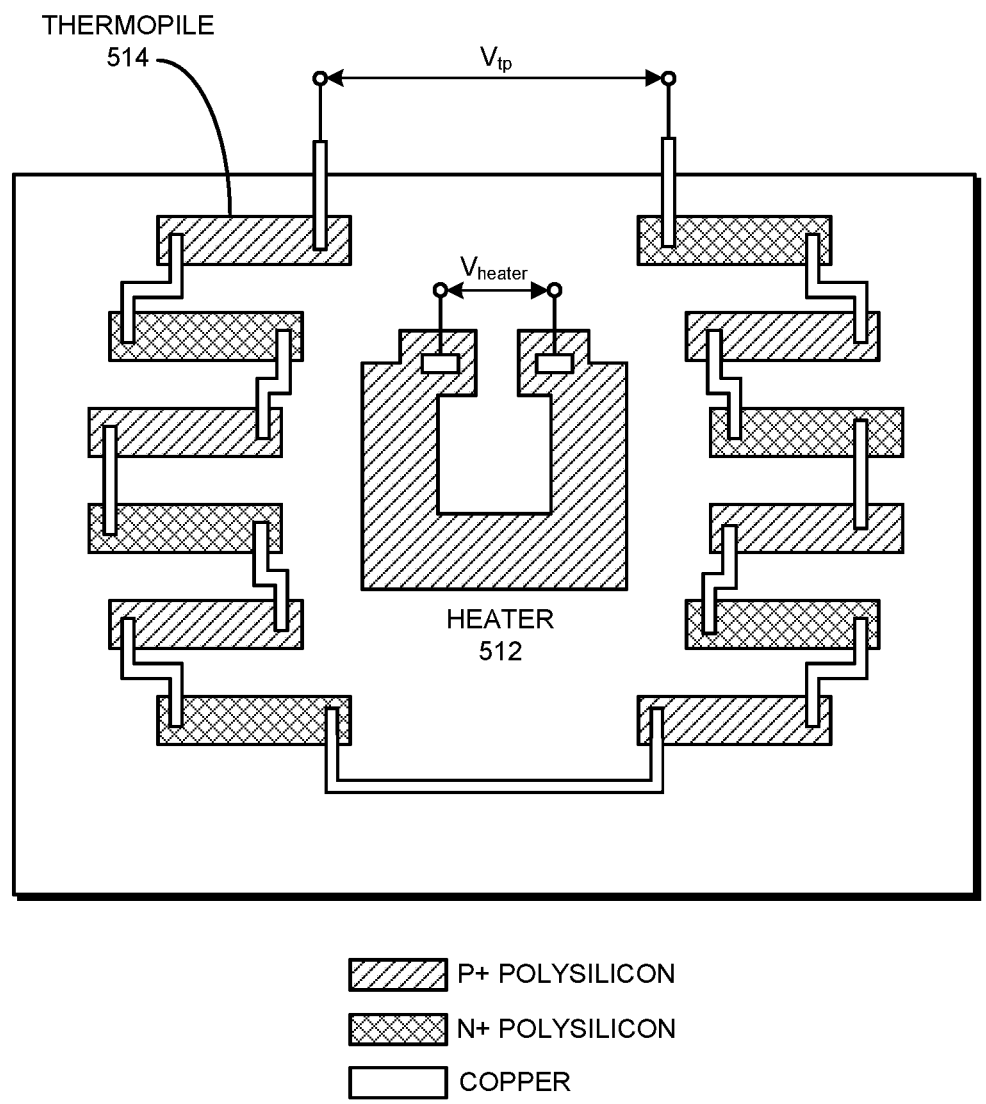
FIG. 5B illustrates a thermopile with a circular layout in accordance with the disclosed embodiments.

FIG. 5B illustrates an alternative circular layout for an ETF, which is implemented in polysilicon. In this circular layout, heater 512 is implemented as a circular ring of P+ polysilicon instead of a strip as in FIG. 5A, and the thermopile 514 is similarly implemented as a surrounding circular ring. Note that this circular layout is more tolerant to semiconductor manufacturing variations that cause heater 512 to be shifted relative the thermopile 514. For example, if heater 502 in the implementation illustrated in FIG. 5A is shifted relative the thermopile 504, then the resulting voltage measurements taken from $V_{tp}$ are affected. In contrast, in the circular implementation illustrated in FIG. 5B, if circular heater 514 is shifted relative to circular thermopile 514, then the circular geometry tends to compensate for this shift and resulting voltage measurements taken from $V_{tp}$ are more accurate.

Process of Operation

Figure 6:
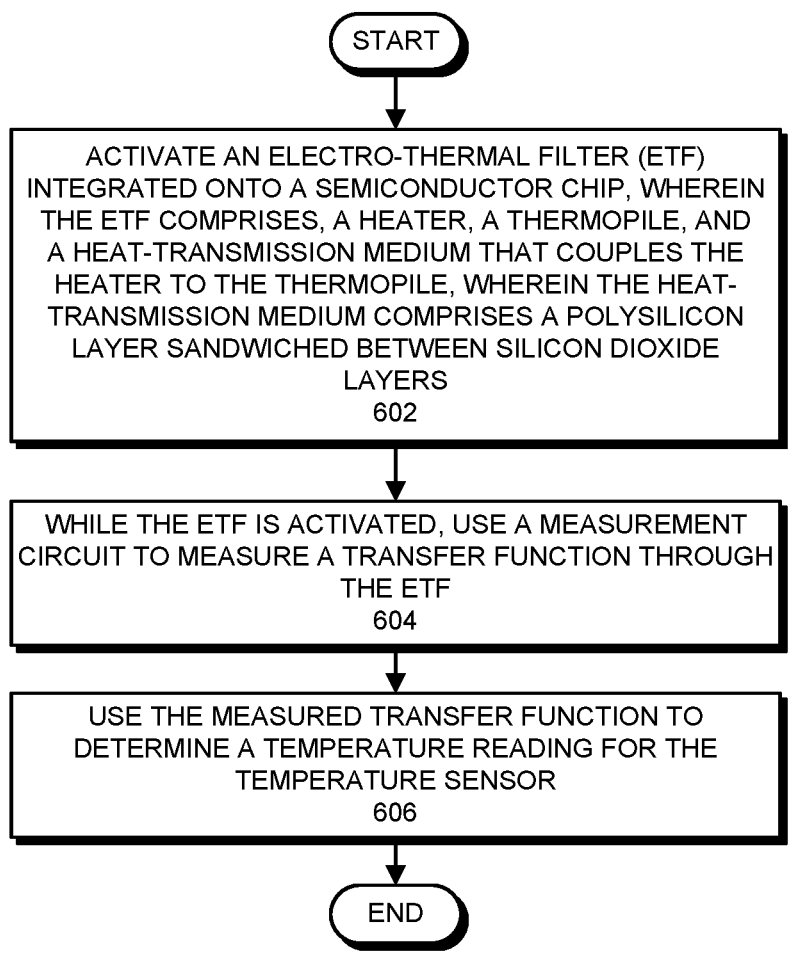
FIG. 6 presents a flow chart illustrating how a thermal-diffusivity temperature sensor that is implemented in polysilicon operates in accordance with the disclosed embodiments.

FIG. 6 presents a flow chart illustrating how a system comprising a thermal-diffusivity temperature sensor, which is implemented in polysilicon, operates in accordance with the disclosed embodiments. During operation, the system activates an electro-thermal filter (ETF), which is integrated onto a semiconductor chip, wherein the ETF comprises a heater, a thermopile, and a heat-transmission medium that couples the heater to the thermopile, wherein the heat-transmission medium comprises a polysilicon layer sandwiched between silicon dioxide layers (step 602). While the ETF is activated, the system uses a measurement circuit to measure a transfer function through the ETF (step 604). Finally, the system uses the measured transfer function to determine a temperature reading for the temperature sensor (step 606).

System

Figure 7:
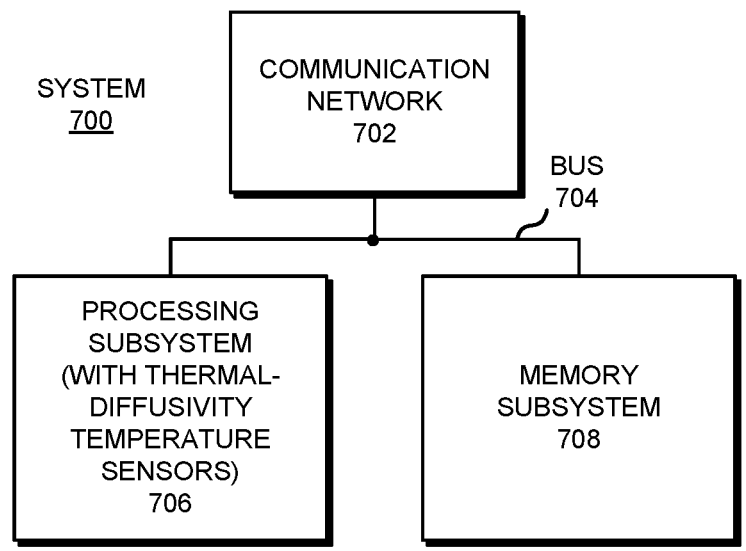
FIG. 7 illustrates a system that includes thermal-diffusivity temperature sensors in accordance with an embodiment of the present disclosure.

One or more of the preceding embodiments of the temperature sensor may be included in a system or device. More specifically, FIG. 7 illustrates a system 700 that includes a processing subsystem 706, which includes one or more thermal-diffusivity temperature sensors. As illustrated in FIG. 7, system 700 includes a processing subsystem 706 comprising one or more processors, a memory subsystem 708 comprising one or more memories, and a communication network 702, which are all connected through a bus 704.

In general, components within communication network 702 and system 700 may be implemented using a combination of hardware and/or software. Thus, system 700 may include one or more program modules or sets of instructions stored in a memory subsystem 708 (such as DRAM or another type of volatile or non-volatile computer-readable memory), which, during operation, may be executed by processing subsystem 706. Furthermore, instructions in the various modules in memory subsystem 708 may be implemented in: a high-level procedural language, an object-oriented programming language, and/or in an assembly or machine language. Note that the programming language may be compiled or interpreted, e.g., configurable or configured, to be executed by the processing subsystem.

Components in system 700 may be coupled by signal lines, links or buses, such as bus 704. These connections may include electrical, optical, or electro-optical communication of signals and/or data. Furthermore, in the preceding embodiments, some components are shown directly connected to one another, while others are shown connected via intermediate components. In each instance, the method of interconnection, or "coupling," establishes some desired communication between two or more circuit nodes, or terminals. Such coupling may often be accomplished using a number of photonic or circuit configurations, as will be understood by those of skill in the art; for example, photonic coupling, AC coupling and/or DC coupling may be used.

In some embodiments, functionality in these circuits, components and devices may be implemented in one or more: application-specific integrated circuits (ASICs), field-programmable gate arrays (FPGAs), and/or one or more digital signal processors (DSPs). Furthermore, functionality in the preceding embodiments may be implemented more in hardware and less in software, or less in hardware and more in software, as is known in the art. In general, system 700 may be at one location or may be distributed over multiple, geographically dispersed locations.

System 700 may include: a switch, a hub, a bridge, a router, a communication system (such as a wavelength-division-multiplexing communication system), a storage area network, a data center, a network (such as a local area network), and/or a computer system (such as a multiple-core processor computer system). Furthermore, the computer system may include, but is not limited to: a server (such as a multi-socket, multi-rack server), a laptop computer, a communication device or system, a personal computer, a work station, a mainframe computer, a blade, an enterprise computer, a data center, a tablet computer, a supercomputer, a network-attached-storage (NAS) system, a storage-area-network (SAN) system, a media player (such as an MP3 player), an appliance, a subnotebook/netbook, a tablet computer, a smartphone, a cellular telephone, a network appliance, a set-top box, a personal digital assistant (PDA), a toy, a controller, a digital signal processor, a game console, a device controller, a computational engine within an appliance, a consumer-electronic device, a portable computing device or a portable electronic device, a personal organizer, and/or another electronic device.

Moreover, communication network 702 can be used in a wide variety of applications, such as: communications (for example, in a transceiver, an optical interconnect or an optical link, such as for intra-chip or inter-chip communication), a radio-frequency filter, a biosensor, data storage (such as an optical-storage device or system), medicine (such as a diagnostic technique or surgery), a barcode scanner, metrology (such as precision measurements of distance), manufacturing (cutting or welding), a lithographic process, data storage (such as an optical-storage device or system) and/or entertainment (a laser light show).

Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A temperature sensor, comprising:
    a semiconductor chip;
    an electro-thermal filter (ETF) integrated onto the semiconductor chip, wherein the ETF comprises,
        a heater,
        a thermopile, and
        a heat-transmission medium that couples the heater to the thermopile, wherein the heat-transmission medium comprises a polysilicon layer sandwiched between silicon dioxide layers, wherein the thermopile comprises a sequence of alternating N+ and P+ segments of polysilicon having opposite temperature gradients, wherein the heater is implemented as a circular ring of P+ polysilicon, and wherein the heater is in the middle of the alternating N+ and P+ segments; and
    a measurement circuit that measures a transfer function through the ETF to determine a temperature reading for the temperature sensor.

2. The temperature sensor of claim 1, wherein the heater is comprised of polysilicon.

3. The temperature sensor of claim 1, wherein the thermopile is comprised of polysilicon.

4. The temperature sensor of claim 3, wherein the heater, the thermopile and the polysilicon layer in the heat-transmission medium are all implemented in a single polysilicon layer.

5. The temperature sensor of claim 1, wherein the measurement circuit has a constant-frequency architecture that applies a constant frequency to the ETF and measures a resulting phase shift $\Phi_{ETF}$, which is translated into the temperature reading.

6. The temperature sensor of claim 5, wherein the constant-frequency architecture uses sigma-delta modulation to measure the resulting phase shift $\Phi_{ETF}$.

7. The temperature sensor of claim 6, wherein the constant-frequency architecture comprises:
    a constant-frequency input that feeds into an input of the ETF and into the phase rotator;
    the phase rotator with an input and an output;
    a mixer that mixes an output of the ETF with the output of the phase rotator to produce a mixed signal;
    an integrator that integrates the mixed signal to produce an integrated signal; and
    an analog-to-digital converter (ADC) that converts the integrated signal into a digital output, which feeds into the input of the phase rotator.

8. The temperature sensor of claim 1, wherein the measurement circuit has a constant-phase architecture that applies a constant phase shift to the ETF and measures a resulting frequency $f_{ETF}$, which is translated into the temperature reading.

9. The temperature sensor of claim 8, wherein the constant-phase architecture comprises:
a mixer that mixes an output of the ETF with a voltage-controlled oscillator (VCO) output signal to produced a mixed signal;
an integrator that integrates the mixed signal to produce an integrated signal; and
a voltage-controlled oscillator (VCO) that receives the integrated signal and produces the VCO output signal, which feeds into inputs of the ETF and the mixer.

10. A system, comprising:
a semiconductor chip with at least one processor;
at least one memory coupled to the at least one processor; and
an electro-thermal filter (ETF) integrated onto the semiconductor chip, wherein the ETF comprises,
a heater,
a thermopile, and
a heat-transmission medium that couples the heater to the thermopile, wherein the heat-transmission medium comprises a polysilicon layer sandwiched between silicon dioxide layers, wherein the thermopile comprises a sequence of alternating N+ and P+ segments of polysilicon having opposite temperature gradients wherein the heater is implemented as a circular ring of P+ polysilicon, and wherein the heater is in the middle of the alternating N+ and P+ segments; and
a measurement circuit integrated onto the semiconductor chip that measures a transfer function through the ETF to determine a temperature reading for the temperature sensor.

11. The system of claim 10, wherein the heater and the thermopile are comprised of polysilicon.

12. The system of claim 11, wherein the heater, the thermopile and the polysilicon layer in the heat-transmission medium are all implemented in a single polysilicon layer.

13. The system of claim 10, wherein the measurement circuit has a constant-frequency architecture that applies a constant frequency to the ETF and measures a resulting phase shift $\Phi_{ETF}$, which is translated into the temperature reading.

14. The system of claim 13, wherein the constant-frequency architecture uses sigma-delta modulation to measure the resulting phase shift $\Phi_{ETF}$.

15. The system of claim 14, wherein the constant-frequency architecture comprises:
a constant-frequency input that feeds into an input of the ETF and into the phase rotator;
the phase rotator with an input and an output;
a mixer that mixes an output of the ETF with the output of the phase rotator to produce a mixed signal;
an integrator that integrates the mixed signal to produce an integrated signal; and
an analog-to-digital converter (ADC) that converts the integrated signal into a digital output, which feeds into the input of the phase rotator.

16. The system of claim 10, wherein the measurement circuit has a constant-phase architecture that applies a constant phase shift to the ETF and measures a resulting frequency $f_{ETF}$, which is translated into the temperature reading.

17. The system of claim 16, wherein the constant-phase architecture comprises:
a mixer that mixes an output of the ETF with a voltage-controlled oscillator (VCO) output signal to produced a mixed signal;
an integrator that integrates the mixed signal to produce an integrated signal; and
a voltage-controlled oscillator (VCO) that receives the integrated signal and produces the VCO output signal, which feeds into inputs of the ETF and the mixer.

18. A method for sensing a temperature, comprising:
operating an electro-thermal filter (ETF) integrated onto a semiconductor chip, wherein the ETF comprises,
a heater,
a thermopile, and
a heat-transmission medium that couples the heater to the thermopile, wherein the heat-transmission medium comprises a polysilicon layer sandwiched between silicon dioxide layers, wherein the thermopile comprises a sequence of alternating N+ and P+ segments of polysilicon having opposite temperature gradients, wherein the heater is implemented as a circular ring of P+ polysilicon, and wherein the heater is in the middle of the alternating N+ and P+ segments; and
while the ETF is operating, using a measurement circuit to measure a transfer function through the ETF; and
using the measured transfer function to determine a temperature reading for the temperature sensor.

* * * * *

UNITED STATES PATENT AND TRADEMARK OFFICE
CERTIFICATE OF CORRECTION

PATENT NO. : 10,672,964 B2
APPLICATION NO. : 15/237281
DATED : June 2, 2020
INVENTOR(S) : Saeedi et al.

Page 1 of 1

It is certified that error appears in the above-identified patent and that said Letters Patent is hereby corrected as shown below:

On the Title Page

In Column 2, under Abstract, Line 5, delete "heater;" and insert -- heater, --, therefor.

In the Claims

In Column 9, Line 30, in Claim 10, delete "gradients" and insert -- gradients, --, therefor.

Signed and Sealed this
Twentieth Day of April, 2021

Drew Hirshfeld
*Performing the Functions and Duties of the
Under Secretary of Commerce for Intellectual Property and
Director of the United States Patent and Trademark Office*